(12) United States Patent
Nakajima

(10) Patent No.: US 6,243,487 B1
(45) Date of Patent: *Jun. 5, 2001

(54) PATTERN EXPOSURE METHOD USING ELECTRON BEAM

(75) Inventor: Ken Nakajima, Tokyo (JP)

(73) Assignee: NEC Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/050,355

(22) Filed: Mar. 31, 1998

(30) Foreign Application Priority Data

Mar. 31, 1997 (JP) .................................. 9-081541

(51) Int. Cl.$^7$ .................................. G03F 7/20
(52) U.S. Cl. ............... 382/144; 250/429.3; 430/30; 430/932; 430/942
(58) Field of Search ............... 382/141, 144, 382/145, 148, 151, 173, 254, 266; 356/237.4, 237.5; 348/87, 126; 438/707–709, 712, 717, 949, 950, 736, 738, 746, 795; 250/492.2, 492.21, 492.22, 492.23, 492.24, 492.3; 430/15, 30, 296, 932, 297–299, 311–318, 942; 702/159, 40, 128, 137; 216/48, 99

(56) References Cited

U.S. PATENT DOCUMENTS

| | | | |
|---|---|---|---|
| 5,008,553 | * 4/1991 | Abe | 250/492.2 |
| 5,278,419 | * 1/1994 | Takahashi et al. | 250/492.2 |
| 5,278,421 | * 1/1994 | Yoda et al. | 250/492.22 |
| 5,563,419 | * 10/1996 | Tamura | 250/492.22 |
| 5,644,138 | * 7/1997 | Hamaguchi | 250/492.22 |
| 5,657,235 | * 8/1997 | Liebermann et al. | 364/474.24 |
| 5,667,923 | * 9/1997 | Kanata | 430/30 |
| 5,798,196 | * 8/1998 | Okino | 430/30 |
| 6,087,052 | * 7/2000 | Manabe et al. | 430/30 |

FOREIGN PATENT DOCUMENTS

| | | | |
|---|---|---|---|
| H4-212407 | 4/1992 | (JP) | H01L/21/27 |
| 5-160010 | 6/1993 | (JP) | |
| H7-78737 | 3/1995 | (JP) | H01L/21/27 |
| 8-37146 | 2/1996 | (JP) | |

OTHER PUBLICATIONS

M. Parikh et al., "Energy Deposition Functions in Electron Resist Films on Substracts", Journal Appl. Phys., vol. 50, No. 2, Feb. 1979, pp. 1104–1111.

M. Parikh, "Correcting to Proximity Effects in Electron Beam Lithography", Journal Appl. Phys., vol. 50, No. 6, Jun. 1979, pp. 4371–4377.

G. Owen et al., "Proximity Effect Corrections for Electron Beam Lithography by Equalization of Background Dose", Journal Appl. Phys., vol. 54, No. 6, Jun. 1983, pp. 3573–3581.

T. H. P. Chang, Proximity Effect in Electron–Beam Lithography, Journal Vacuum Society Technology, vol. 12, No. 6, Nov./Dec. 1975, pp. 1271–1275.

* cited by examiner

Primary Examiner—Bhavesh Mehta
Assistant Examiner—Brian Werner
(74) Attorney, Agent, or Firm—Sughrue, Mion, Zinn, Macpeak & Seas, PLLC (57) ABSTRACT

Disclosed is a pattern exposure method for conducting an overlay exposure to a base pattern previously formed by using electron beam, which has the steps of: 1) dividing a group of patterns formed on the base pattern into arbitrary regions; 2) calculating an area density of the base pattern in each of the arbitrary regions; 3) generating a pattern according to the area density; 4) conducting sub-exposure using the pattern; and 5) conducting main exposure to expose a desired pattern.

8 Claims, 7 Drawing Sheets

STEP 1: DIVIDING PATTERN FORMED ON Nth BASE LAYER INTO REGIONS

↓

STEP 2: CALCULATING PATTERN AREA DENSITY OF EACH REGION

↓ ⟶ MAKING AREA DENSITY MAP

STEP 3: GENERATING RECTANGULAR PATTERN TO EACH REGION AND SETTING EXPOSURE QUANTITY (GENERATING SUB-EXPOSURE PATTERN TO Nth BASE LAYER)

⊲⎯⎯ GENERATING SUB-EXPOSURE PATTERN FOR BASE LAYER TO INFLUENCE

· GENERATING BASE LAYER PATTERN ASSUMED TO INFLUENCE BACKSCATTERING WHEN EXPOSING DESIRED PATTERN

↓

STEP 4: EXPOSING SUB-EXPOSURE PATTERN (OVERLAY) EXPOSURE)

↓

STEP 5: MAIN EXPOSURE USING DESIRED PATTERN (OVERLAY) EXPOSURE)

· SETTING OPTIMUM EXPOSURE QUANTITY BY SUBTRACTING AN EXPOSURE QUANTITY TO ENERGY INTENSITY ACCUMULATED BY SUB-EXPOSURE

PATTERN EXPOSURE METHOD USING ELECTRON BEAM

FIELD OF THE INVENTION

This invention relates to a pattern exposure method using electron beam (electron beam lithography), and more particularly to, a pattern exposure method of exposing directly a desired pattern onto resist by using electron beam.

BACKGROUND OF THE INVENTION

In conventional electron beam lithography, when a desired pattern is exposed using electron beam, compensations for a proximity effect between exposed patterns (interproximity effect) and a proximity effect within a pattern (intra-proximity effect) are, in advance, conducted.

In this regard, correction methods, such as Ghost method (G. Owen et al., J. Vac. Technol. B3, 153(1985)) and self-consistent method (M. Parikh, J. Appl. Phys. 50, 4371 (1979)), are generally used.

To quantify the proximity effect, exposure intensity distribution (EID) function (T. H. P. Chang, J. Vac. Sci. Technol. 12, 1271(1975)), which is given by summing two Gaussian distributions as shown in expression (1), is used.

$$f(r)=1/(1+\eta)\pi*[1/\beta f^2*\exp(-r^2/\beta f^2)+\eta/\beta b^2*\exp(-r^2/\beta b^2) \quad (1)$$

Figure 1:
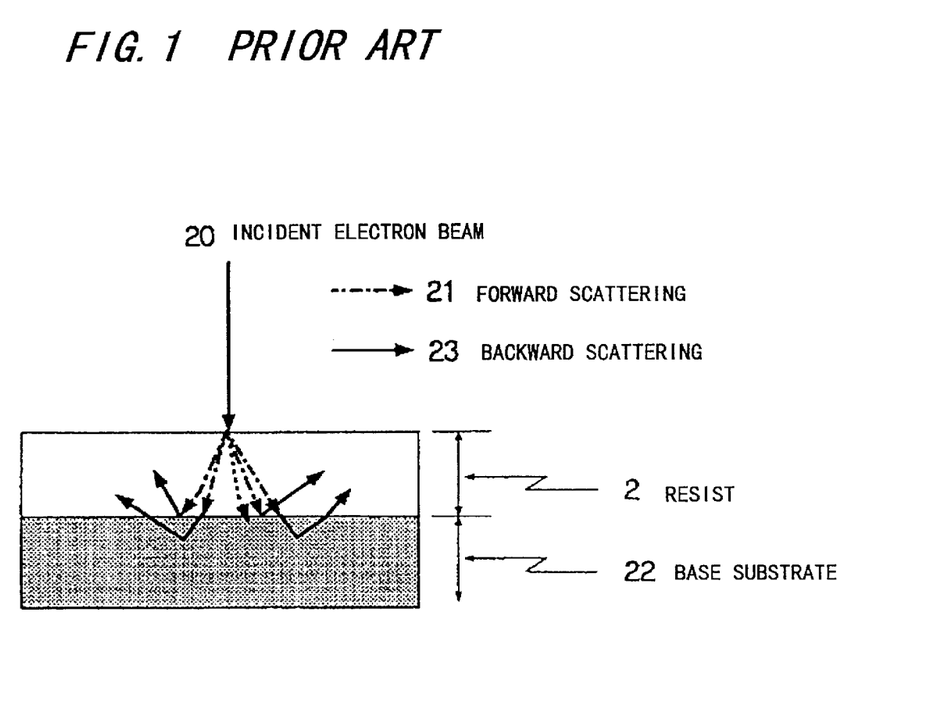
FIG. 1 is an illustration showing a conventional pattern exposure method using electron beam.

The first item of expression (1) (EID function) represents an energy distribution accumulated when electron (incident electron beam 20) addressed to the resist 2 penetrates thereinto while forward-scattering, and the second item of expression (1) represents an energy distribution accumulated when electron (incident electron beam 20) is, as shown by arrows 23, backward-scattered by the atomic nucleus in the resist 2 and base substrate 22 in the direction reverse to the incident direction.

Meanwhile, in expression (1), "$\beta f$" is called "forward-scattering diameter (standard deviation of Gaussian distribution at the first item)", "$\beta b$" is called "backward-scattering diameter (standard deviation of Gaussian distribution at the second item)", and "$\eta$" is called "backward-scattering ratio (the coefficient of energy accumulated by backward scattering and energy accumulated by forward scattering)". The constants, "$\beta f$", "$\beta b$" and "$\eta$" are generally obtained by a computer simulation, where the shield Rutherford scattering formula and Bethe energy loss formula are used [M. Parikh and D. F. Kyser, J. Appl. 50, 1104(1979)].

Especially, the backward-scattering coefficient "$\eta$" of the above constants is dependent on the base substrate 22 and is generally determined by atomic weight, density and film thickness of only a base material to be etched after exposure.

Proximity effect compensation methods used typically are based upon the above-mentioned proximity effect compensation methods. However, they cause a decrease in exposure throughput and a long-time operation in correction calculation as ULSI with finer-structure and higher-density has been recently developed.

Further, although the dimension accuracy is required to be less than 10% of a designed dimension, there can occur a lack of dimension accuracy in the typical correction methods.

Japanese patent application laid-open Nos. 5-160010 (1993) and 8-37146(1996) disclose simplified correction methods to overcome a decrease in exposure throughput and a long-time operation in correction calculation.

In these methods, a drawing area is, in advance, obtained for each region with an arbitrary size to given patterns, then a supplemental exposure by using a quantity of exposure dependent on the area is conducted, the proximity effect between desired exposure patterns is equalized, and a desired pattern is exposed with decrease by the quantity of the supplement exposure.

However, the lack of correction dimension accuracy cannot be solved even by these methods since they are based on the compensation of the intershape proximity effect and intrashape proximity effect.

As described above, the conventional proximity effect correction methods used when conducting the exposure using electron beam are based on only the compensation of the intershape proximity effect and intrashape proximity effect. Namely, they do not take the influences (energy accumulation due to backward scattering) of a base substrate structure with complicated arrangement and shape already provided into account.

Furthermore, even when an overlay exposure by using electron beam is conducted in a process for complicated base structure, such as a wiring process, the influences of the base substrate are not taken into account. Thus, it causes a reduction in resist dimension accuracy after the exposure.

The causes of the accuracy reduction will be detailed below.

In the EID function (represented by expression (1)) to be used when calculating the proximity effect correction, the influences of the base structure (energy accumulation due to backward scattering) is estimated by the second item of expression (1).

The backward-scattering diameter "$\beta b$" and the backward-scattering coefficient "$\eta$" in the second item are constants to determine the quantity of accumulated energy due to backward scattering. However, these constants are provided based on that influences of base structure are equal. Thus, a complicated structure, a shape and an arrangement of pattern, a kind of film material etc. already formed cannot be taken into account.

Especially when metal wirings overlapped several layers are exposed overlaying on a base layer already formed, the reduction of dimension accuracy in the resist pattern obtained by conducting the conventional proximity effect correction becomes significant.

Recently, dimension accuracy less than 0.020 $\mu$m, that corresponds to 10% of design dimension less than 0.20 $\mu$m, is needed with the developing of higher-density and finer-structure device. Therefore, it is indispensable to avoid the lack of proximity effect correction to base layer that may cause the reduction of dimension accuracy.

SUMMARY OF THE INVENTION

Accordingly, it is an object of the invention to provide a pattern exposure method where a good resist pattern can be obtained while using the conventional proximity effect correction.

According to the invention, a pattern exposure method for conducting an overlay exposure to a base pattern previously formed by using electron beam, comprises the steps of:

1) dividing a group of patterns formed on the base pattern into arbitrary regions;

2) calculating an area density of the base pattern in each of the arbitrary regions;

3) generating a pattern according to the area density;

4) conducting sub-exposure using the pattern; and 5) conducting main exposure to expose a desired pattern.

In this invention, the influences (accumulated energy by backscattering) of the base layers, which are not considered in the conventional methods, can be effectively equalized by generating rectangular patterns to be calculated from pattern area density of each base layer, then conducting the sub-exposure by using these patterns. Therefore, a resist pattern with a good dimension accuracy can be obtained even by conducting the conventional intershape and intrashape proximity effect correction. For example, a dimension accuracy of 0.04 μm can be improved to less than 0.02 μm.

BRIEF DESCRIPTION OF THE DRAWINGS

The invention will be explained in more detail in conjunction with the appended drawings, wherein.

DESCRIPTION OF THE PREFERRED EMBODIMENTS

Before explaining a pattern exposure method in the preferred embodiment, the aforementioned conventional pattern exposure method will be explained in FIGS. 1 to 3C.

FIG. 1 shows conventional electron beam lithography, where incident electron beam 20 is scattered in resist 2 and is further scattered reflecting on a base substrate 22. In FIG. 1, arrows 21 with dotted line indicate the forward scattering directions and arrows 23 with full line indicate the backward scattering directions.

Figure 2:
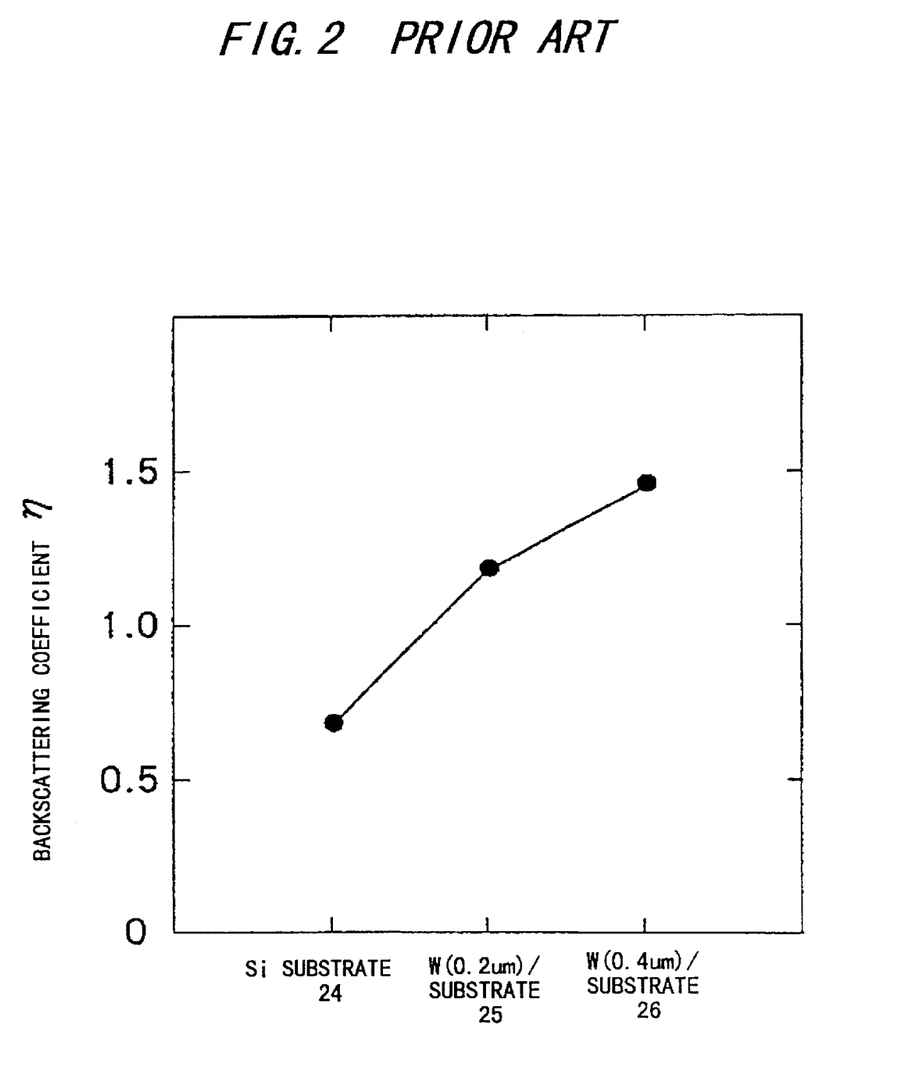
FIG. 2 is a graph showing the relations ("substrate kind dependencies") between structures of base substrate and backward-scattering coefficient "η".

FIG. 2 shows "substrate kind dependencies" when a silicon-only substrate 24, a W(0.2 μm)/silicon substrate 25 and a W(0.4 μm)/silicon substrate 26 are used as base substrates. When the atomic weight and density of base substrate is increased, the quantity of electron to be reflected from the base substrate is increased. Due to this, as shown in FIG. 2, the backward-scattering coefficient "η" is increased, and there occurs an increase in accumulated energy caused by the backward-scattering from the base substrate.

Figure 3A:
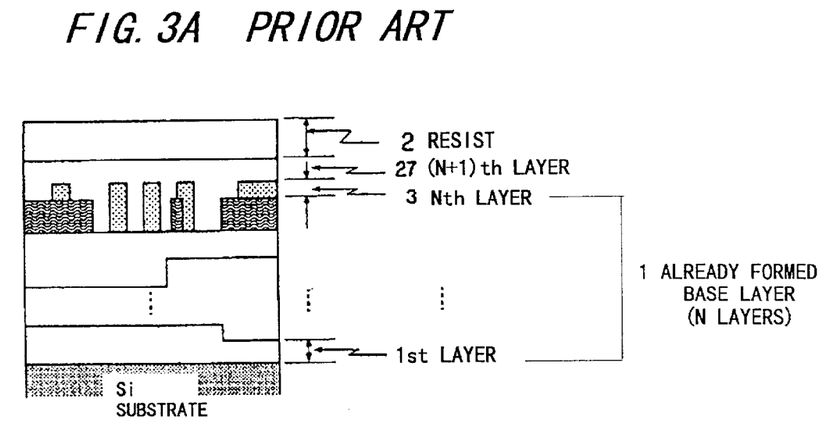
FIGS. 3A to 3C are illustrations showing a reduction in resist dimension accuracy after exposure in the conventional pattern exposure method using electron beam.

Taking an example shown in FIG. 3A, a base pattern (wiring, capacity electrode etc.) using W, Ti, Ru, Ta etc. is locally formed on a Nth layer 3, and a (N+1)th layer 27 to be etched after exposing by electron beam is of insulating film, such as oxidized film and nitrified film. In this case, although the correction is typically conducted determining the constant in the second item of the EID function to the (N+1)th layer 27, the local influence of the Nth layer 3 as the base layer of the (N+1)th layer 27 is not taken into account.

Figure 3B:
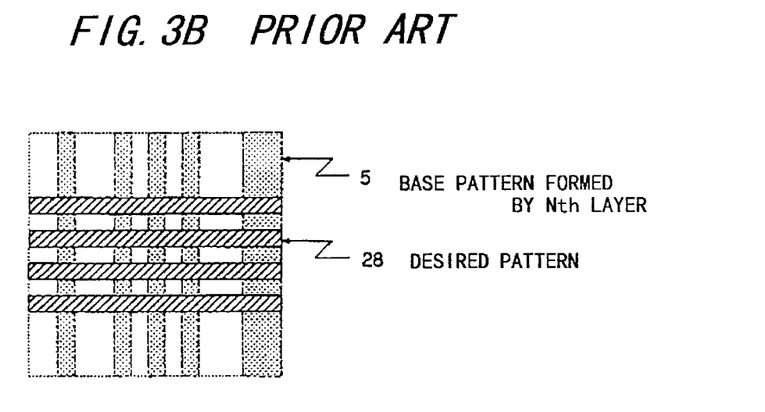
Figure 3C:
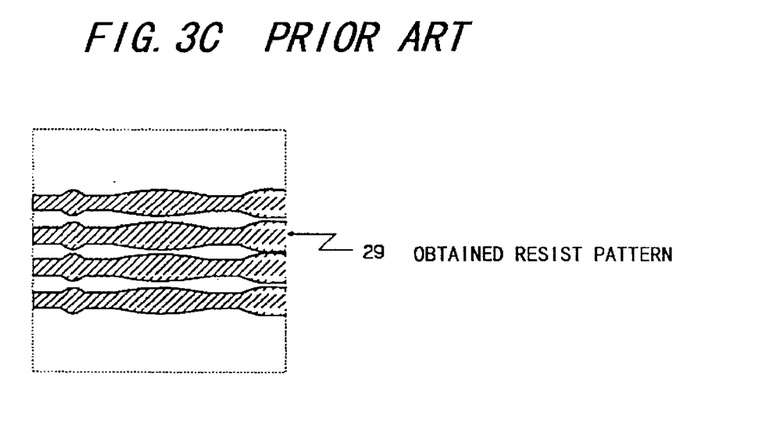

Thus, as shown in FIG. 3B, the accuracy of the proximity effect correction to a desired pattern 28 has to be reduced due to the energy accumulated by backward scattering of a base pattern 5 formed on the Nth layer 3. Also, as shown in FIG. 3C, it causes a reduction in dimension accuracy of a resist pattern 29 obtained.

Figure 4:
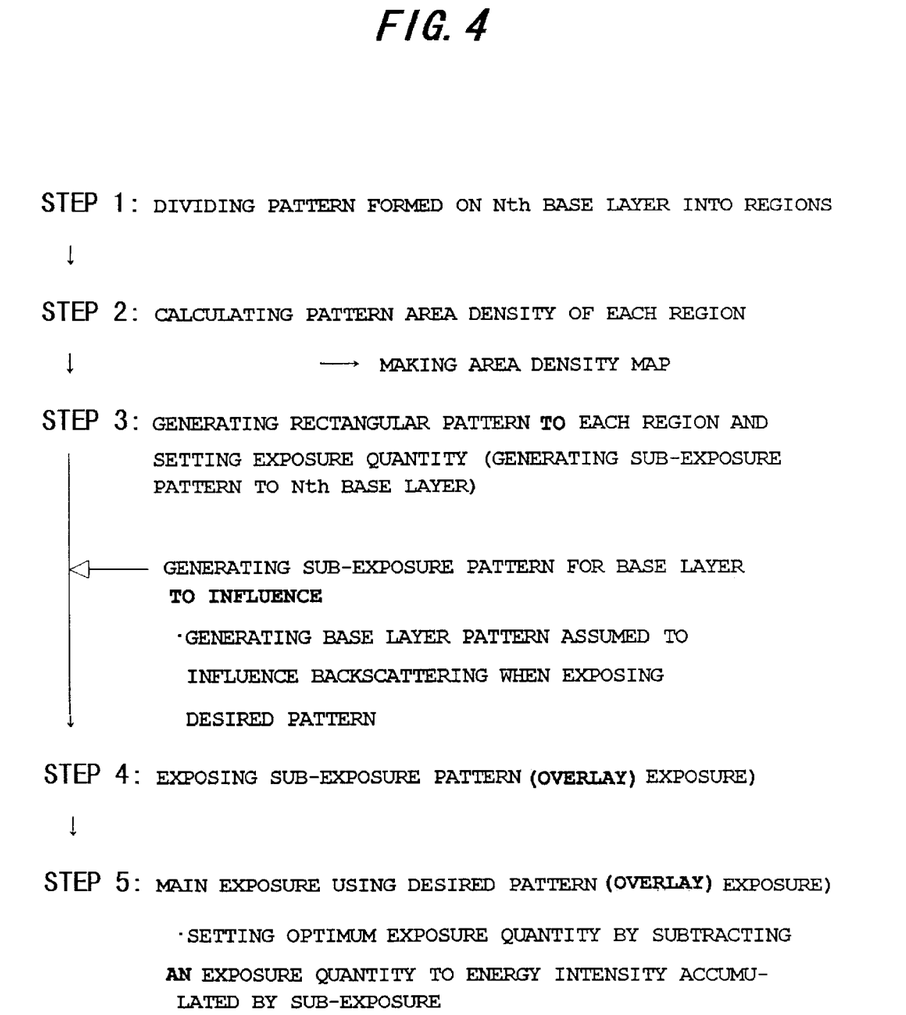
FIG. 4 is a flow chart showing a pattern exposure method using electron beam in a first preferred embodiment, where influences of backward scattering from a base layer are considered.

Next, a pattern exposure method using electron beam in the first preferred embodiment, where influences of backward scattering from a base layer are considered, will be explained in FIG. 4.

In the first embodiment, in step 1, a pattern formed on an Nth layer as a base layer is divided into regions with an arbitrary size (about backscattering diameter).

Then, in step 2, the pattern area density of each divided region is obtained, thereby making the area density map of the Nth layer. Then, in step 3, a rectangular pattern for sub-exposure to each region is generated, then setting an arbitrary quantity of exposure.

The processes in steps 1 to 3 are repeated by the number of base layers to influence the backscattering when a desired pattern is exposed, then generating sub-exposure patterns to each of the base layers.

Then, in step 4, the overlay exposure of the sub-exposure patterns obtained is conducted. Finally, in step 5, main exposure is conducted using a desired pattern. In this case, the exposure is conducted subtracting an exposure quantity corresponding to energy intensity accumulated by the backscattering of the sub-exposure from the optimum exposure quantity of the desired pattern to be obtained by the normal proximity effect correction.

Figure 5A:
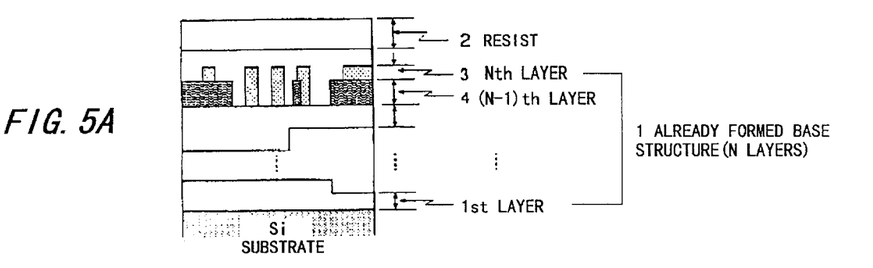
FIGS. 5A to 5C are illustrations showing the process of making area density map in step 2 in the first embodiment.
Figure 5B:
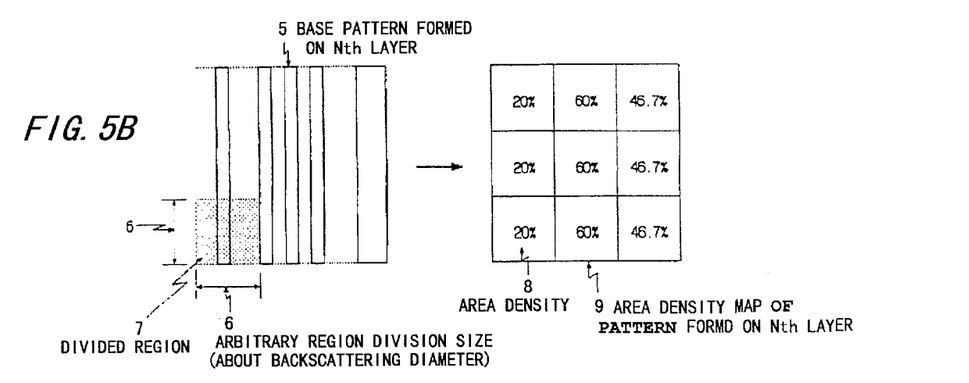
Figure 5C:
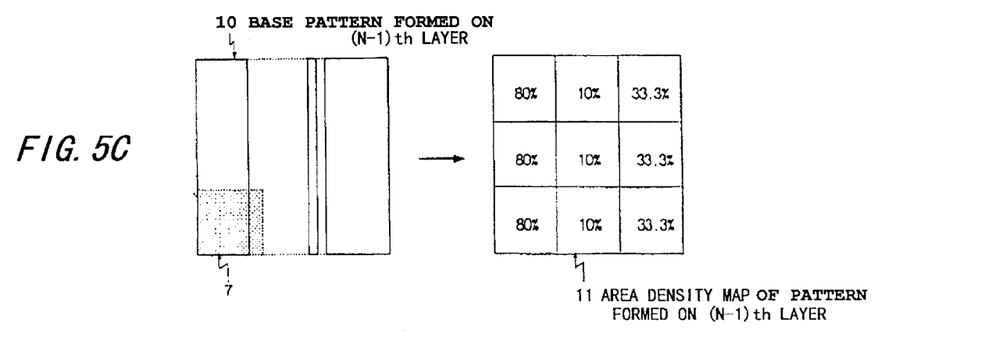

The process of making the area density map in step 2 will be detailed in FIGS. 5A to 5C.

As shown in FIG. 5A, taken is an example that a desired pattern is exposed on resist 2 on a substrate with base structure 1 (composed of N base layers). Area density maps are made for an Nth layer 3 and a (N−1)th layer 4.

First, as shown in FIG. 5B, a base pattern 5 formed on the Nth layer 3 is divided into regions with an arbitrary region division size 6 that is nearly equal to a backscattering diameter.

Then, an area density 8 occupied by part of the base pattern 5 is obtained for each divided region 7, thereby making the area density map 9 of the base pattern 5 formed on the Nth layer 3.

In like manner, as shown in FIG. 5C, the area density map 10 of base pattern 10 formed on (N−1)th layer 4 is made.

Using the obtained area density maps 9 and 10, the rectangular pattern for sub-exposure to each region is generated, then the exposure quantity is set.

Figure 6A:
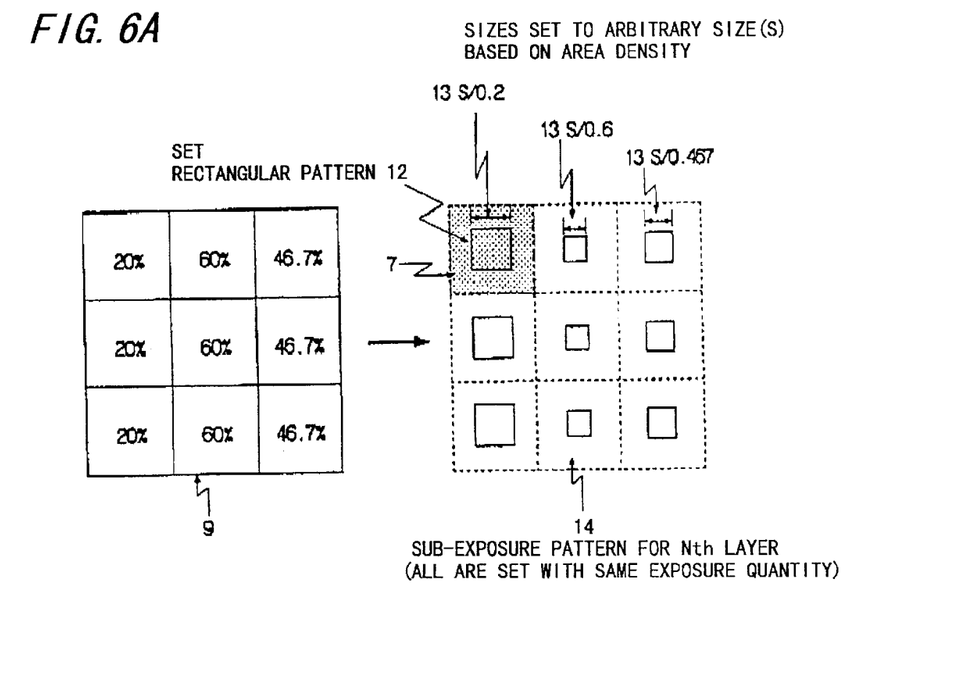
FIGS. 6A and 6B are illustrations showing processes in step 3 in the first embodiment, where there is provided an example that an exposure quantity in the exposing of sub-exposure pattern is set to be constant.
Figure 6B:
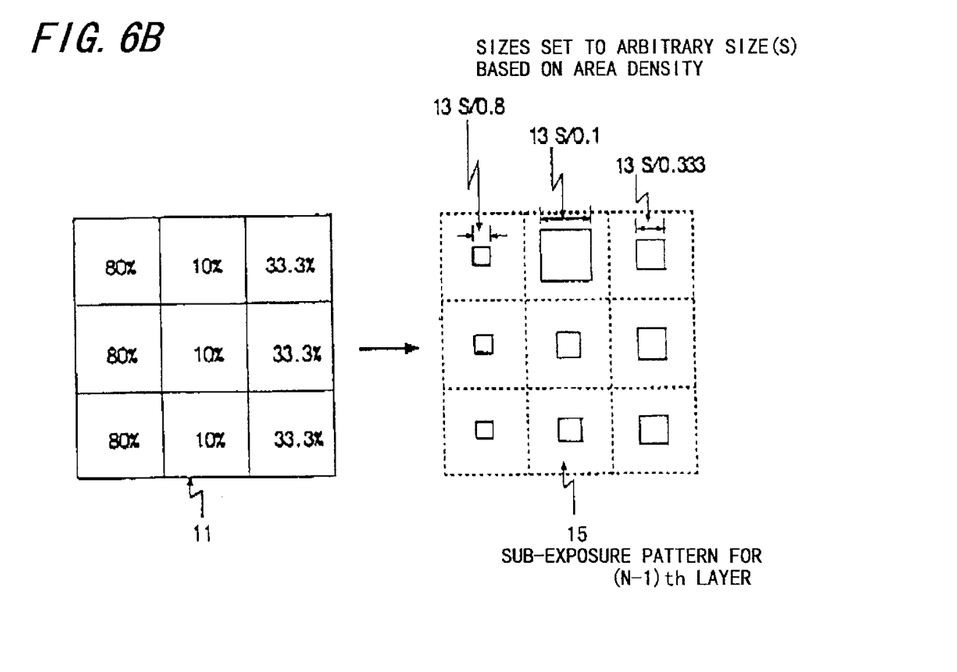

FIGS. 6A and 6B illustrate the processes in step 3, taking an example that the exposure quantity in the exposing of the sub-exposure pattern is set to be constant.

Based on the area density map 9 obtained in step 2, a rectangular pattern 12 with a size according to the area density is generated to each divided region 7 and is disposed at the center of the divided region 7 as shown in FIG. 6A.

The size of the rectangular pattern 12 has to be set to each pattern density 8 as it is required that the exposure quantities of patterns in the sub-exposure are all equal and the energies accumulated by the backcattering of the divided regions 7 are all equal. In the example of FIG. 6A, the size of the rectangular pattern 12 is obtained by dividing an arbitrary size (S) by each area density. Alternatively, the rectangular size maybe obtained by using a preset function, such as a linear function and a quadratic function. Thus, the sub-exposure pattern 14 for the Nth layer 3 can be made.

On the other hand, as shown in FIG. 6B, a rectangular size 13 is, in like manner, obtained by using the area density map 11 made for the (N−1)th layer 4, thereby making a sub-exposure pattern 15 for the (N−1)th layer 4.

In the first embodiment, as described above, the influences (accumulated energy by backscattering) of the base layers to a layer to be etched after exposing by electron beam can be effectively equalized over the entire surface to be exposed with a desired pattern. Therefore, a good resist pattern can be obtained even by conducting the conventional intershape and intrashape proximity effect correction. As a result, the correction accuracy can be improved, thereby enhancing the dimension accuracy of the resist pattern.

Figure 7A:
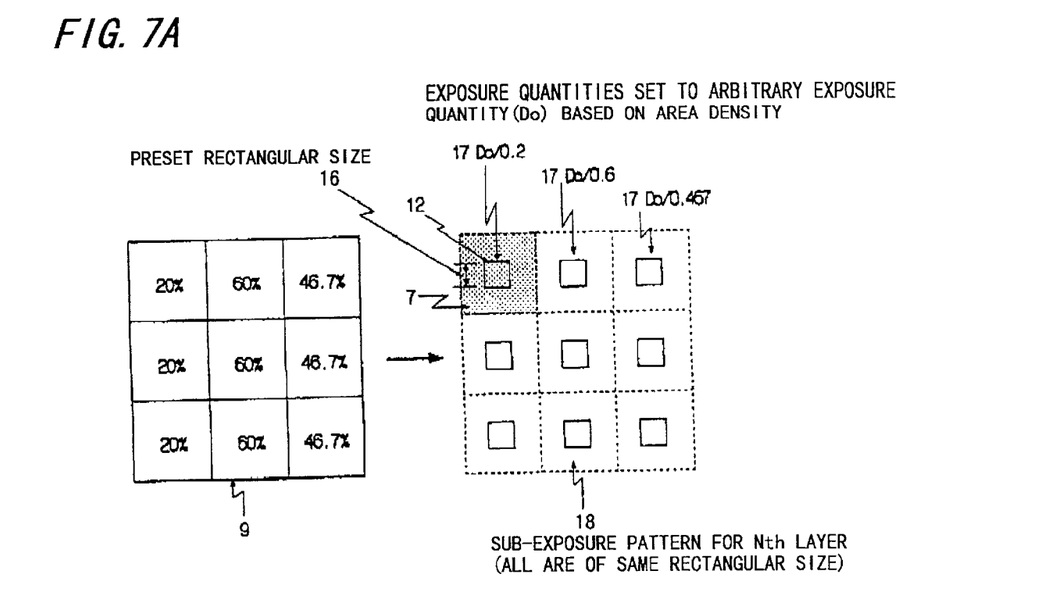
FIGS. 7A and 7B are illustrations showing processes in step 3 in a second preferred embodiment according to the invention, where there is provided an example that a size of sub-exposure pattern is set to be constant.
Figure 7B:
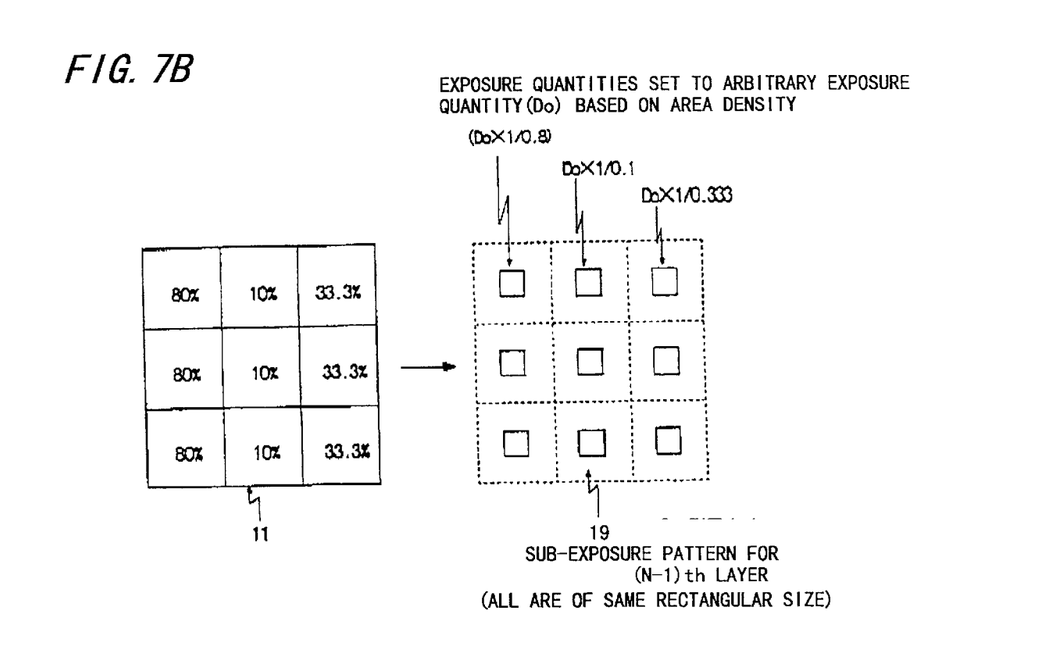

A pattern exposure method using electron beam in the second preferred embodiment will be explained in FIGS. 7A and 7B. In the second embodiment, steps 1, 2, 4 and 5 illustrated by FIG. 4 in the first embodiment are commonly conducted. The process of step 3 in the second embodiment will be explained in FIGS. 7A and 7B. In FIGS. 7A and 7B, given is an example that the size 16 of sub-exposure pattern is set to be constant.

In the second embodiment, based on the area density map 9 for the Nth layer obtained in step 2, the rectangular pattern 12 with a preset size is generated to each divided region 7 and is disposed at the center of the divided region 7 as shown in FIG. 7A.

The exposure quantity of the rectangular pattern 12 has to be set to each pattern density 8 as it is required that the energies accumulated by the backcattering of the divided regions 7 are all equal whereas the sizes of the rectangular patterns 16 in the respective regions are all equal.

In the example of FIG. 7A, the exposure quantity 17 is obtained by dividing an arbitrary exposure quantity (D0) by each area density. Alternatively, the exposure quantity may be obtained by using a preset function, such as a linear function and a quadratic function. Thus, the sub-exposure pattern 18 for the Nth layer 3 can be made.

On the other hand, as shown in FIG. 7B, an exposure quantity 17 is, in like manner, obtained by using the area density map 11 made for the (N−1)th layer 4, thereby making a sub-exposure pattern 19 for the (N−1)th layer 4.

In the second embodiment, as described above, the influences (accumulated energy by backscattering) of the base layers to a layer to be etched after exposing by electron beam can be effectively equalized over the entire surface to be exposed with a desired pattern. Therefore, a good resist pattern can be obtained even by conducting the conventional intershape and inttrashape proximity effect correction. As a result, the correction accuracy can be improved, thereby enhancing the dimension accuracy of the resist pattern.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A pattern exposure method for conducting an overlay exposure to a base pattern previously formed by using an electron beam, comprising the steps of:

1) dividing a group of patterns formed on said base pattern into arbitrary size regions;

2) calculating an area density of said base pattern in each of said arbitrary size regions;

3) generating a first pattern according to said area density of said base pattern in each of said arbitrary size regions;

4) conducting sub-exposure using said first pattern; and 5) conducting main exposure using a second pattern to expose a desired pattern, wherein exposure quantity is set by subtracting an exposure quantity of energy intensity accumulated by said sub-exposure from the optimum exposure quanity of the second pattern.

2. A pattern exposure method according to claim 1, wherein: in step 2) for calculating an area density of said base pattern in each of said arbitrary regions, area densities of a plurality of base patterns previously formed are calculated to make an area density map of each of said base patterns previously formed.

3. A pattern exposure method, according to claim 1, wherein:

in step 3) for generating a first pattern according to said area density, a rectangular pattern according of said area density to each of said divided regions is disposed at the center of each of said divided regions to make a group of patterns for sub-exposure.

4. A pattern exposure method, according to claim 3, wherein:

said rectangular pattern disposed in said group of patterns for sub-exposure is exposed with a same exposure quantity depending on a kind of film to form said base pattern.

5. A pattern exposure method, according to claim 1, wherein:

in step 3) for generating a first pattern according to said area density, a rectangular pattern with an arbitrary same size to each of said divided regions is disposed at the center of each of said divided regions to make a group of patterns for sub-exposure.

6. A pattern exposure method, according to claim 5, wherein:

said rectangular pattern disposed in said group of patterns for sub-exposure is exposed with an optimum exposure quantity depending on the area density of each of said divided regions.

7. A pattern exposure method, according to claim 1, wherein:

in step 5) for conducting main exposure to expose a desired pattern, the main exposure is conducted subtracting an exposure quantity depending on the base structure and the exposure quantity of sub-exposure.

8. A pattern exposure method according to claim 1 wherein said steps 1), 2), 3) and 4) are repeated N times for N base patterns previously formed, and wherein N is an integer greater than or equal to 2.

* * * * *